US009953958B2

(12) United States Patent
Miki

(10) Patent No.: US 9,953,958 B2
(45) Date of Patent: *Apr. 24, 2018

(54) ELECTRONIC COMPONENT DEVICE

(71) Applicant: SHINKO ELECTRIC INDUSTRIES CO., LTD., Nagano-shi, Nagano (JP)

(72) Inventor: Shota Miki, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/206,417

(22) Filed: Jul. 11, 2016

(65) Prior Publication Data
US 2017/0018533 A1 Jan. 19, 2017

(30) Foreign Application Priority Data
Jul. 14, 2015 (JP) ................. 2015-140305

(51) Int. Cl.
*H01L 23/31* (2006.01)
*H01L 25/065* (2006.01)
(Continued)

(52) U.S. Cl.
CPC ...... *H01L 25/0657* (2013.01); *H01L 23/3135* (2013.01); *H01L 25/50* (2013.01); *H01L 21/563* (2013.01); *H01L 23/3128* (2013.01); *H01L 2224/16145* (2013.01); *H01L 2224/73204* (2013.01); *H01L 2225/06513* (2013.01); *H01L 2225/06517* (2013.01); *H01L 2225/06541* (2013.01); *H01L 2225/06593* (2013.01); *H01L 2924/15311* (2013.01); *H01L 2924/1815* (2013.01)

(58) Field of Classification Search
CPC . H01L 25/0657; H01L 25/50; H01L 23/3142; H01L 23/3121; H01L 23/18; H01L 21/563; H01L 23/544; H01L 25/0652; H01L 24/97; H01L 24/81; H01L 23/3114; H01L 23/3135
See application file for complete search history.

(56) References Cited

U.S. PATENT DOCUMENTS

2013/0037943 A1  2/2013  Yamano
2013/0137216 A1*  5/2013  Ito ................. H01L 25/0652
                                         438/108
(Continued)

FOREIGN PATENT DOCUMENTS

JP    2013-55313    3/2013

*Primary Examiner* — Bitew Dinke
(74) *Attorney, Agent, or Firm* — Rankin, Hill & Clark LLP

(57) ABSTRACT

An electronic component device includes a first electronic component, a second electronic component disposed on and connected to the first electronic component, a first underfill resin filled between the first electronic component and the second electronic component, the first underfill resin having a base part arranged around the second electronic component and a convex portion formed on an upper surface of the base part, a third electronic component disposed on and connected to the second electronic component with being in contact with the convex portion of the base part at a peripheral edge portion thereof, and a second underfill resin filled between the second electronic component and the third electronic component.

11 Claims, 19 Drawing Sheets

(51) Int. Cl.
*H01L 25/00* (2006.01)
*H01L 21/56* (2006.01)

(56) References Cited

U.S. PATENT DOCUMENTS

| | | | |
|---|---|---|---|
| 2013/0249085 A1* | 9/2013 | Ide | H01L 23/49811 257/737 |
| 2014/0287541 A1* | 9/2014 | Yasumura | H01L 24/05 438/15 |
| 2015/0069596 A1* | 3/2015 | Kawasaki | H01L 23/367 257/712 |
| 2015/0130083 A1* | 5/2015 | Park | H01L 25/0657 257/777 |
| 2015/0214191 A1* | 7/2015 | Lee | H01L 25/0657 257/712 |
| 2015/0228624 A1* | 8/2015 | Miki | H01L 25/0657 257/778 |
| 2015/0380394 A1* | 12/2015 | Jang | H01L 25/50 438/108 |
| 2016/0079184 A1* | 3/2016 | Tsukiyama | H01L 24/16 257/737 |
| 2016/0141273 A1* | 5/2016 | Tsuji | H01L 23/544 257/737 |
| 2016/0329304 A1* | 11/2016 | Hatakeyama | H01L 24/97 |
| 2017/0018534 A1* | 1/2017 | Miki | H01L 25/0657 |
| 2017/0040297 A1* | 2/2017 | Kitada | H01L 25/0657 |

* cited by examiner

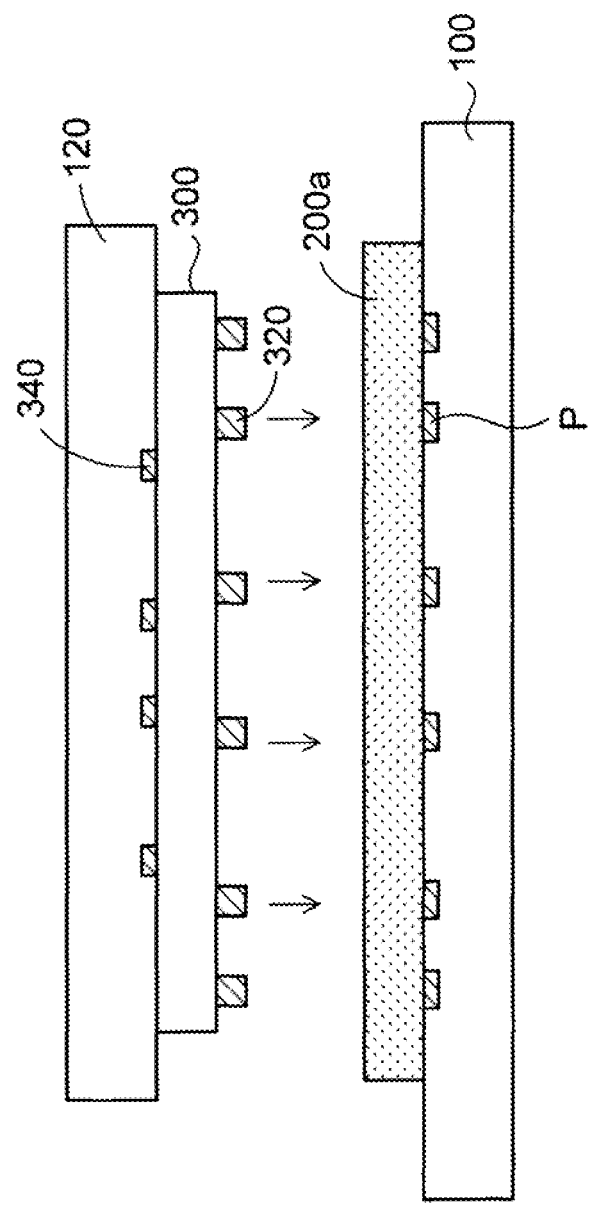

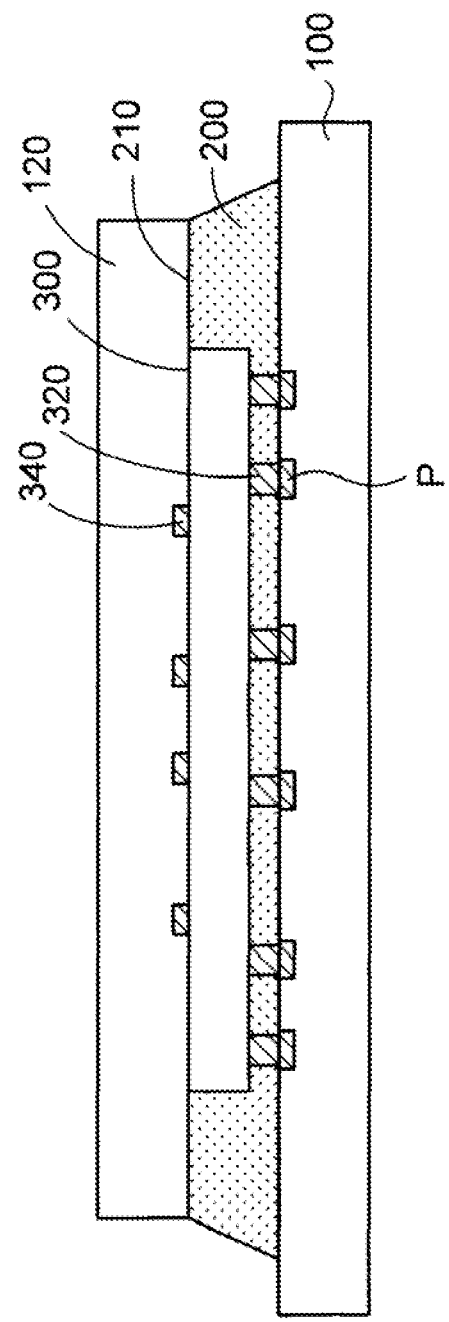
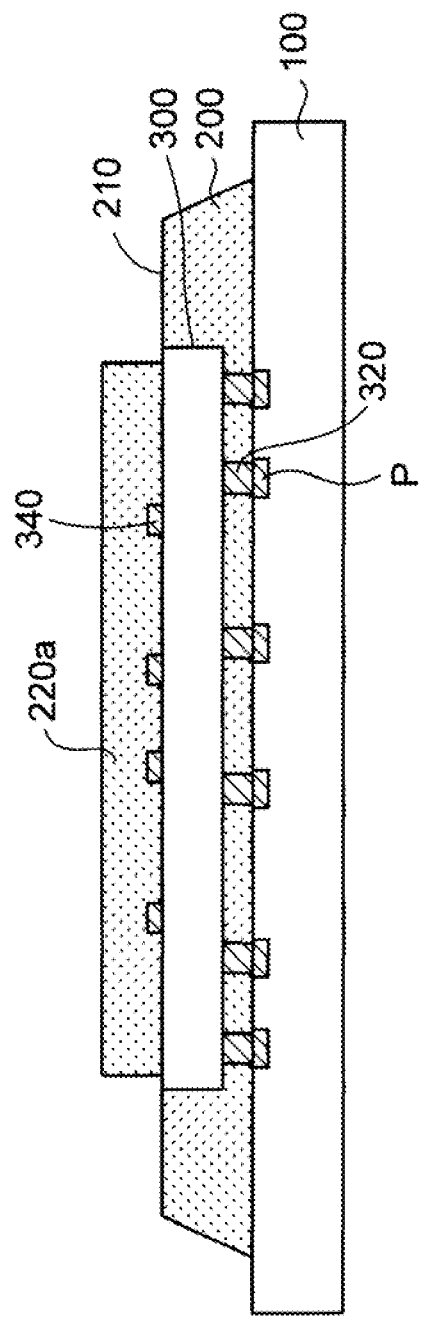

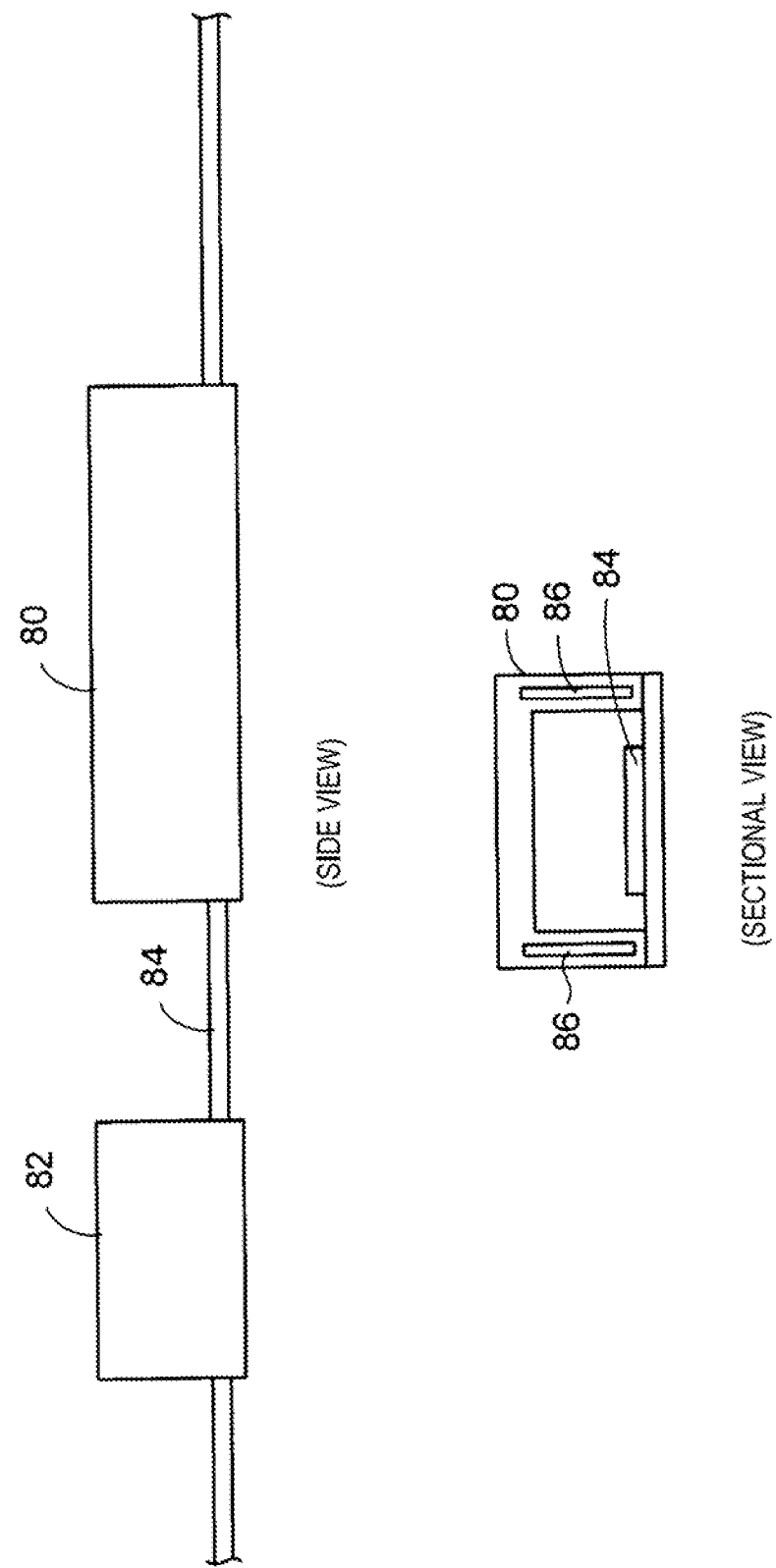

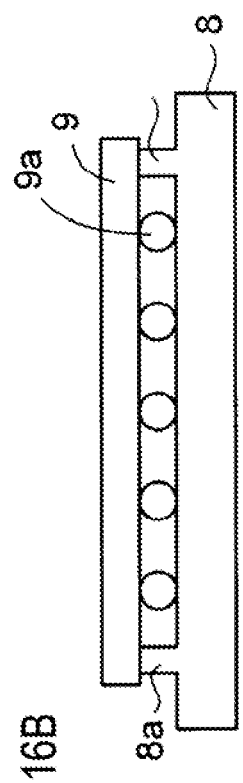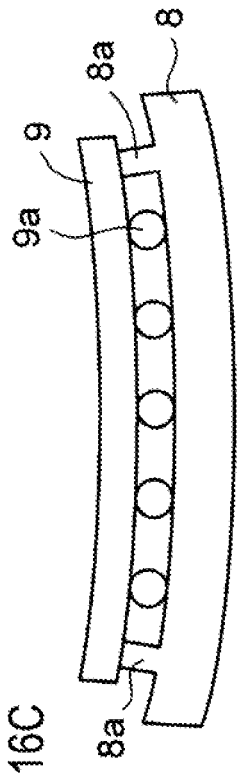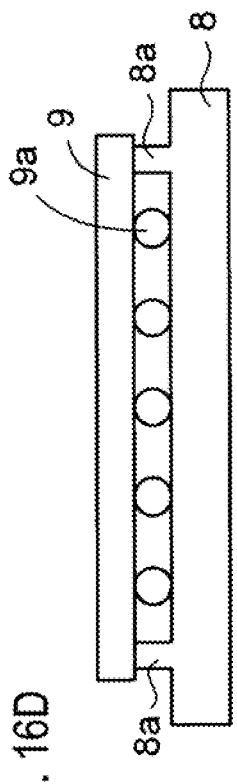

ELECTRONIC COMPONENT DEVICE

CROSS-REFERENCE TO RELATED APPLICATION

The present application claims priority from Japanese Patent Application No. 2015-140305 filed on Jul. 14, 2015, the entire content of which is incorporated herein by reference.

BACKGROUND

Technical Field

The disclosure relates to an electronic component device.

In the related art, an electronic component device where an electronic component such as a semiconductor chip is mounted on a wiring substrate has been known. Regarding the electronic component device, a technology of flip-chip connecting a first semiconductor chip on the wiring substrate and then flip-chip connecting a second semiconductor chip on the first semiconductor chip so as to intend additional high density of mounting has been developed.

[Patent Document 1] Japanese Patent Application Publication No. 2013-55313A

As described later in paragraphs of preliminary matters, a manufacturing method of a multi-layer electronic component device includes a process of connecting solders of a semiconductor module having semiconductor chips stacked therein to electrodes of a substrate-side through reflow heating using a bonding tool.

At this time, since the semiconductor module is thick, an actual reflow temperature is lower than a set temperature of the bonding tool, so that it is not possible to reliably connect the semiconductor module.

SUMMARY

Exemplary embodiments of the invention provide an electronic component device having electronic components stacked therein with as novel structure capable of implementing reliable connection even when the electronic component is thick.

An electronic component device according to the exemplary embodiment comprises:

a first electronic component;

a second electronic component disposed on and connected to the first electronic component;

a first underfill resin filled between the first electronic component and the second electronic component, the first underfill resin having a base part arranged around the second electronic component and a convex portion formed on an upper surface of the base part;

a third electronic component disposed on and connected to the second electronic component with being in contact with the convex portion of the base part at a peripheral edge portion thereof; and a second underfill resin filled between the second electronic component and the third electronic component.

A manufacturing method of an electronic component device, according to an exemplary embodiment, comprises:

forming a sealing resin material on a first electronic component;

connecting an electrode of a second electronic component to the first electronic component via the sealing resin material, filling a first underfill resin between the first electronic component and the second electronic component, and forming a base part having a convex portion on an upper surface thereof around the second electronic component by the first underfill resin;

arranging a peripheral edge portion of a third electronic component on the convex portion of the first underfill resin, and connecting the third electronic component on the second electronic component via a solder on the basis of heating processing in a reflow furnace; and filling a second underfill resin between the second electronic component and the third electronic component.

According to the below disclosure, in the electronic component device, the second electronic component is disposed on and connected to the first electronic component, and the first underfill resin is filled between the first electronic component and the second electronic component. The first underfill resin has the base part arranged around the second electronic component and the convex portion formed on the upper surface of the base part.

The third electronic component is disposed on and connected to the second electronic component with the peripheral edge portion of the third electronic component being in contact with the convex portion of the base part.

When connecting the third electronic component, the heating processing is performed by the reflow furnace, not a bonding tool. For this reason, even when the third electronic component is thick, it is possible to sufficiently melt solders of the third electronic component.

At this time, a concave-shaped bending occurs in the first electronic component. However, the convex portion of the base part of the first underfill resin functions as a spacer for securing a gap between the peripheral edge portion of the third electronic component and the second electronic component. Thereby, the solder provided at the peripheral edge portion of the third electronic component is prevented from being crushed due to the concave-shaped bending of the first electronic component. As a result, the connection part between the third electronic component and the second electronic component is prevented from being separated, so that the connection reliability is secured.

The first to third electronic components may be a wiring substrate, a silicon interposer, or a semiconductor chip.

BRIEF DESCRIPTION OF THE DRAWINGS

FIG. 2 is a sectional view for illustrating the manufacturing method of the electronic component device relating to the preliminary matters (2 thereof).

FIGS. 3A and 3B are sectional views for illustrating the manufacturing method of the electronic component device relating to the preliminary matters (3 thereof).

FIG. 14 is a side view and a sectional view depicting a reflow furnace that is to be used for the manufacturing method of the electronic component device according to the exemplary embodiment.

FIGS. 16A to 16D pictorially depict a principle for solving the problems depicted in FIG. 15.

DETAILED DESCRIPTION

Hereinafter, an exemplary embodiment will be describe with reference to the accompanying drawings.

Before describing the exemplary embodiment, preliminary matters, which are bases of the disclosure, are first described. It should be noted that the preliminary matters include personal investigation contents of the inventors and are not a known technology.

Figure 1A:
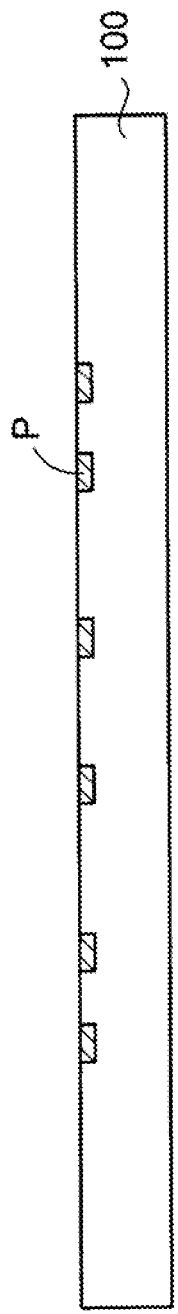
FIGS. 1A and 1B are sectional views for illustrating a manufacturing method of an electronic component device relating to preliminary matters (1 thereof).

In a manufacturing method of a multi-layer electronic component device relating to the preliminary matters, as shown in FIG. 1A, a wiring substrate 100 having connection pads P on an upper surface is first prepared.

Figure 1B:
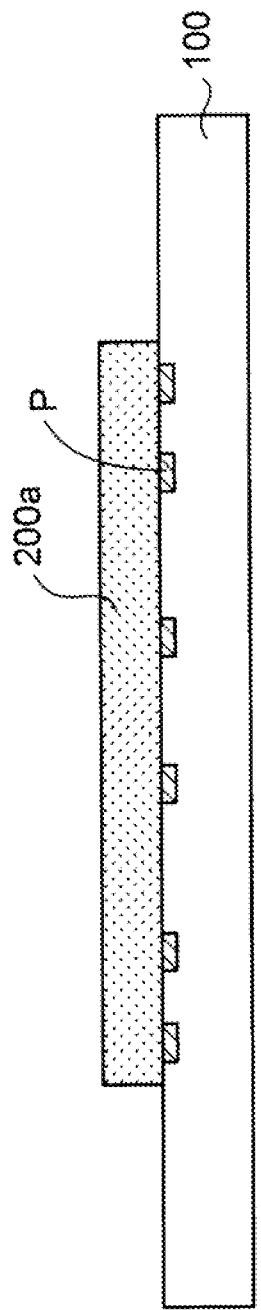

Then, as shown in FIG. 1B, a first semi-cured sealing resin material 200a is formed on the wiring substrate 100. Also, as shown in FIG. 2, a semiconductor chip 300 is prepared.

The semiconductor chip 300 has hump electrodes 320 on an element formation surface-side and connection electrodes 340 on a backside. The bump electrodes 320 and the connection electrodes 340 of the semiconductor chip 300 are connected to each other via through-electrodes (not shown). An area of the first sealing resin material 200a is set to be slightly greater than an area of the semiconductor chip 300.

As shown in FIG. 2, the backside of the semiconductor chip 300 is sucked to a first bonding tool 120. Subsequently, referring to FIG. 3A, the bump electrodes 320 of the semiconductor chip 300 sucked to the first bonding tool 120 are pushed into the first sealing resin material 200a and pressure-contacted to the connection pads P of the wiring substrate 100.

Also, solders (not shown) of tips of the bump electrodes 320 of the semiconductor chip 300 are subjected to reflow by performing heating processing with the first bonding tool 120. Thereby, the bump electrodes 320 of the semiconductor chip 308 are flip-chip connected to the connection pads P of the wiring substrate 100.

By the above processes, a first underfill resin 200 formed of the first sealing resin material 200a is filled between the semiconductor chip 308 and the wiring substrate 100. The first underfill resin 200 is formed, to have a base part 210 around the semiconductor chip 300.

The base part 210 of the first underfill resin 200 is formed as the first sealing resin material 200a is pressed by the peripheral edge portion of the first bonding tool 120. Thereafter, the first bonding tool 120 is removed from the semiconductor chip 300.

Then, as shown in FIG. 3B, a second sealing resin material 220a is formed on the backside of the semiconductor chip 300.

Figure 4:
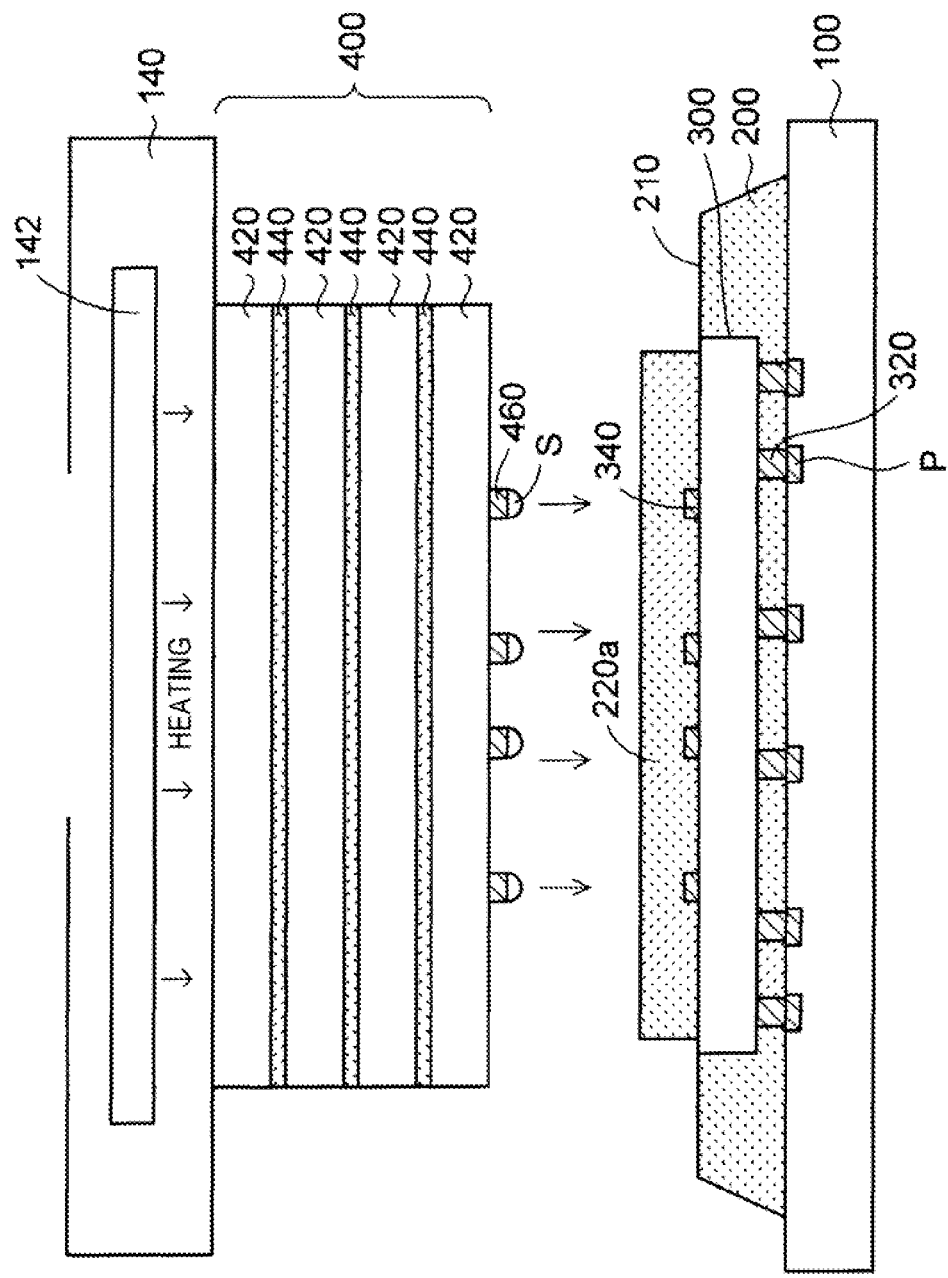
FIG. 4 is a sectional view for illustrating the manufacturing method of the electronic component device relating to the preliminary matters (4 thereof).

Subsequently, as shown in FIG. 4, a semiconductor module 400 in which four semiconductor chips 420 are stacked with resin layers 440 being interposed therebetween is prepared. The semiconductor module 400 has bump electrodes 460 on an element formation surface of the lowest semiconductor chip 420, and solders S are formed at tips of the bump electrodes 460. The four semiconductor chips 420 are connected to each other via through-electrodes formed in respective chip substrates.

Then, as shown in FIG. 4, a second bonding tool 140 having a heating unit 142 is prepared, and a backside of the semiconductor module 400 is sucked to the second bonding tool 140.

Also, the bump electrodes 460 of the semiconductor module 400 sucked to the second bonding tool 140 are pushed into the second sealing, resin material 220a and pressure-contacted to the connection electrodes 340 of the semiconductor chip 300.

Subsequently, the solders S of the tips of the bump electrodes 460 of the semiconductor module 400 are subjected to reflow by performing heating processing with the beating unit 142 of the second bonding tool 140. Thereby, the bump electrodes 460 of the semiconductor module 400 are connected to the connection electrodes 340 of the semiconductor chip 300 through the solders S.

At this time, the second sealing resin material 220a is cured at the same time, so that a second underfill resin (not shown) is filled between the semiconductor chip 300 and the semiconductor module 400.

At this time, when lead-free solders such as tin/silver-based solders or the like are used as the solders S of the tips of the bump electrodes 460 of the semiconductor module 400, the reflow temperature is about 260° C. Therefore, the temperature of the heating unit 142 of the second bonding tool 140 is set to about 260° C. that is the reflow temperature.

However, the second bonding tool 140 and the solders S on the lower side of the semiconductor module 400 are spaced from each other by thicknesses of the four semiconductor chip 420 and the resin layers 440 provided therebetween.

For this reason, the heating temperature applied to the solders S of the tips of the bump electrodes 460 of the semiconductor module 400 is considerably lowered, so that it is not possible to sufficiently reflow-heat the solders S.

This is also caused due to the low thermal conductivity of the resin layers 440 disposed between the semiconductor chips 420.

For example, as shown in FIG. 4, in the semiconductor module 400 having the four semiconductor chips 420 having a thickness of about 50 μm, even when the temperature of the heating unit 142 of the second bonding tool 140 is set to 260° C., the heating temperature to be applied to the solders S is lowered to about 210° C.

As a measure against the above problem, it is considered to raise the set temperature of the heating unit 142 of the second bonding tool 140. However, regarding the semiconductor module 400, a variety of structures where the thicknesses or the number of stacks of the semiconductor chips 420 are different are adopted. Therefore, it is difficult to precisely control the temperature to be applied to the solders S of the semiconductor module 400.

Like this, since the semiconductor module 400 is considerably thicker, as compared to one semiconductor chip, the actual reflow temperature is lower than the set temperature of the heating unit 142 of the second bonding tool 140. For this reason, it is not possible to reliably connect the semiconductor module 400 to the semiconductor chip 300.

An electronic component device and a manufacturing method of an exemplary embodiment, which will be described later, can solve the above problem.

Exemplary Embodiment

Figure 18:
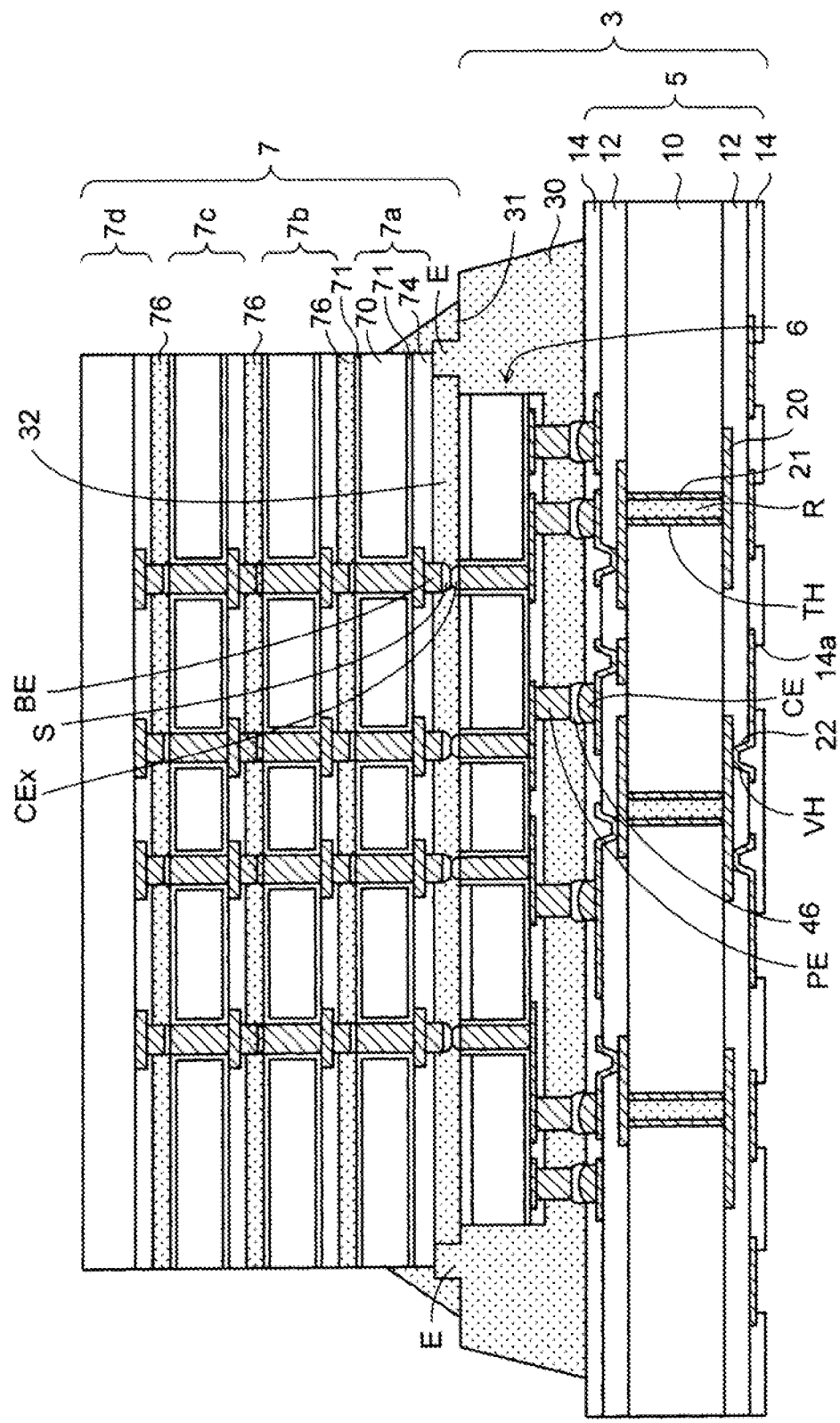
FIG. 18 is a sectional view depicting the manufacturing method of the electronic component device according to the exemplary embodiment (10 thereof).
Figure 19:
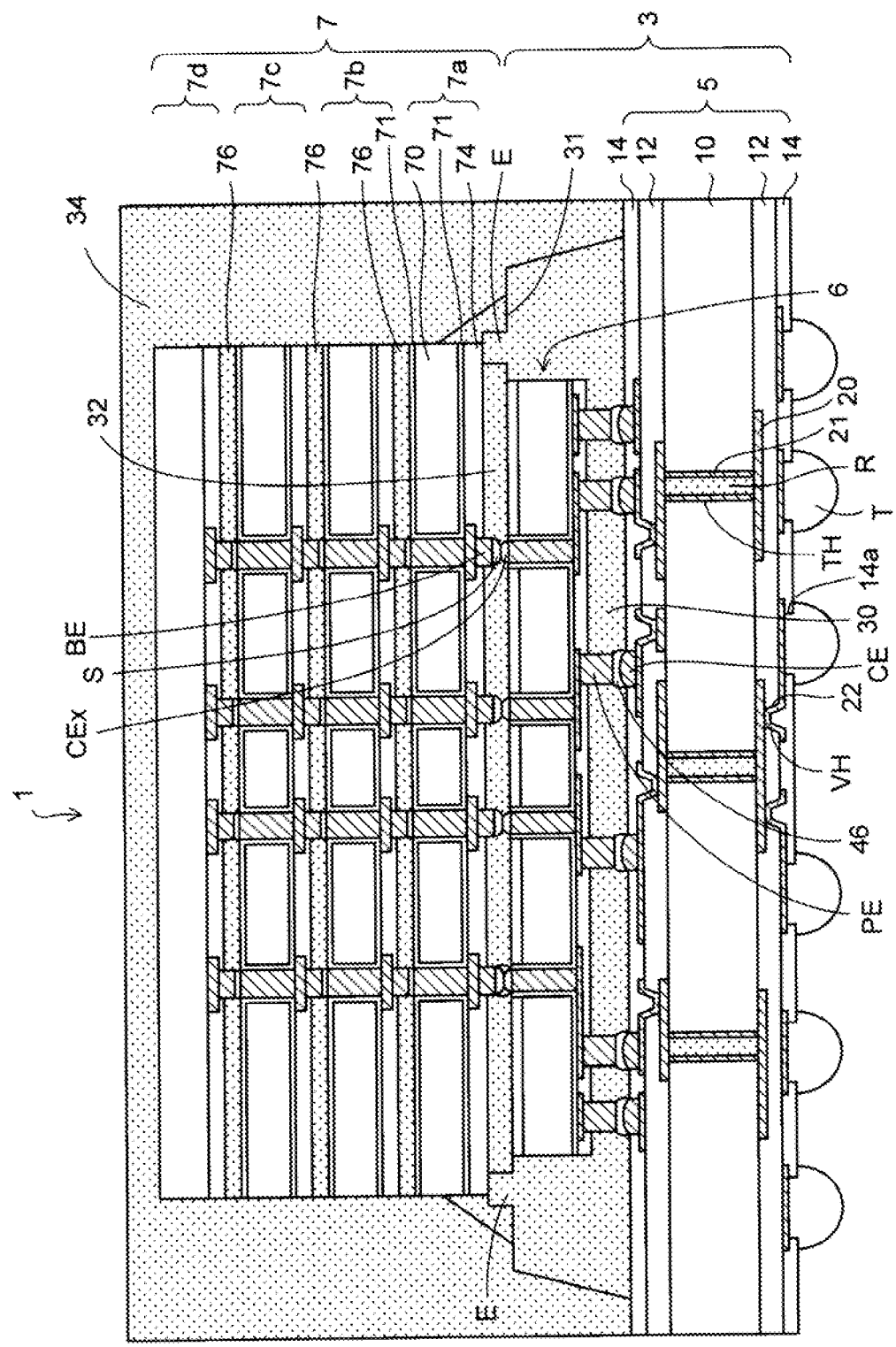
FIG. 19 is a sectional view depicting the manufacturing method of the electronic component device according to the exemplary embodiment (11 thereof).

FIGS. 5 to 18 illustrate a manufacturing method of an electronic component device of an exemplary embodiment, and FIG. 19 depicts an electronic component device of the exemplary embodiment. In the below, a structure of the electronic component device is described while explaining the manufacturing method of the electronic component device.

Figure 5:
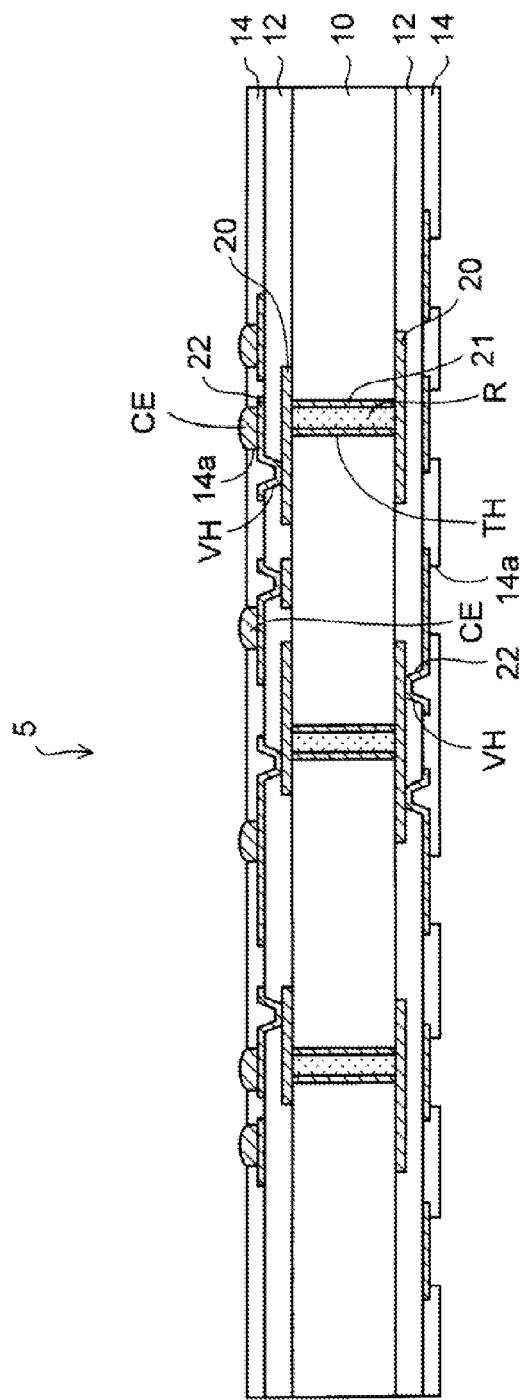
FIG. 5 is a sectional view depicting a manufacturing method of an electronic component device according to an exemplary embodiment (1 thereof).

In the manufacturing method of the electronic component device of the exemplary embodiment, a wiring substrate 5 as shown in FIG. 5 is first prepared. The wiring substrate 5 has a core substrate 10 at a central part in a thickness direction. The core substrate 10 is formed of an insulating material such as a glass epoxy resin or the like. The wiring substrate 5 is an example of the first electronic component Both surfaces of the core substrate 10 are formed with first wiring layers 20 made of copper or copper alloy, respectively. The core substrate 10 is formed with through-holes TH penetrating in the thickness direction. An inner wall of the through-hole TH is formed with a through-hole plating layer 21, and the other part of the through-hole TH is filled with a resin material R. Alternatively, a structure where the entire through-holes TH of the core substrate 10 are filled with through-electrodes by plating may also be adopted.

The first wiring layers 20 formed on both surfaces of the core substrate 10 are connected to each other via the through-hole plating layer 21. Both surfaces of the core substrate 10 are formed with insulating layers 12 having via-holes VH arranged on connection parts of the first wiring layers 20, respectively. The insulating layer 12 is formed of an insulating resin such as an epoxy resin, a polyimide resin or the like.

Also, the insulating layers 12 of both surfaces are formed thereon with second wiring layers 22 connected to the first wiring layers 20 through via-holes VH, respectively. The second wiring layer 22 is formed of copper or copper alloy.

Also, the insulating layers 12 of both surfaces are formed thereon solder resist layers 14 having openings 14a arranged on connection parts of the second wiring layers 22, respectively. The solder resist layer 14 is formed of an insulating resin such as a polyimide resin, an acryl resin or the like.

The connection part of the second wiring layer 22 formed on the upper surface-side of the core substrate 10 is formed with connection electrodes CE such as nickel/gold plating layer, solder or the like.

Then, the wiring substrate 5 is subjected to heating processing of about 125° C. for removing moistures. Also, the upper surface of the wiring substrate 5 is subjected to argon plasma processing for improving wettability. Thereby, preprocessing for forming a sealing resin material is completed.

Figure 6:
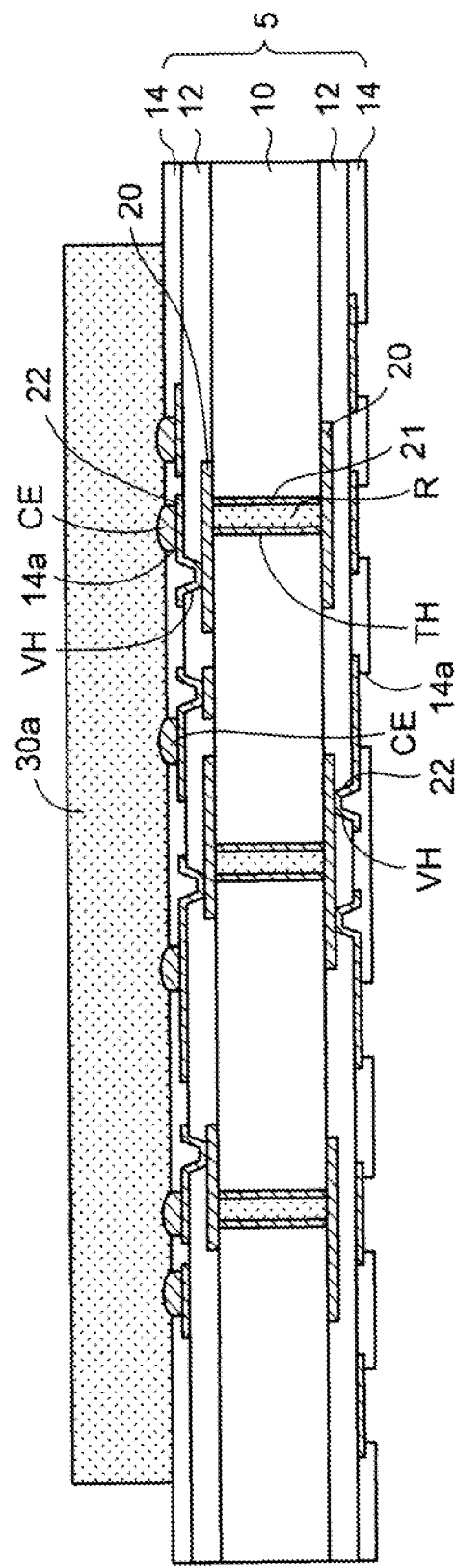
FIG. 6 is a sectional view depicting the manufacturing method of the electronic component device according to the exemplary embodiment (2 thereof).

Subsequently, as shown in FIG. 6, a semi-cured sealing resin material 30a is formed on the wiring substrate 5. In the example of FIG. 6, the sealing resin material 30a is formed of a resin sheet. At this time, an epoxy-based resin, an acryl-based resin or the like is used.

The wiring substrate 5 is a large-sized substrate having a plurality of component mounting regions defined therein. In FIG. 6, one component mounting region is partially shown. The sealing resin material 30a may be arranged with being divided in each component mounting region of the wiring substrate 5 or the sealing resin material 30a may be arranged over the entire surface of the wiring substrate 5.

When dividing and arranging the sealing resin material 30a in each component mounting region of the wiring substrate 5, a masking tape (not shown) having an opening on each component mounting region is bonded on the wiring substrate 5.

Also, a resin sheet (not shown) is bonded on an entire surface of the masking tape and the masking tape is then peeled off. Thereby, parts of the resin sheet arranged in the openings of the masking tape remain in an island form on the component mounting region.

Alternatively, instead of using the resin sheet as the sealing resin material 30a, a liquid resin may be applied to the plurality of component mounting regions of the wiring substrate 5 by a dispenser or the like.

Figure 7:
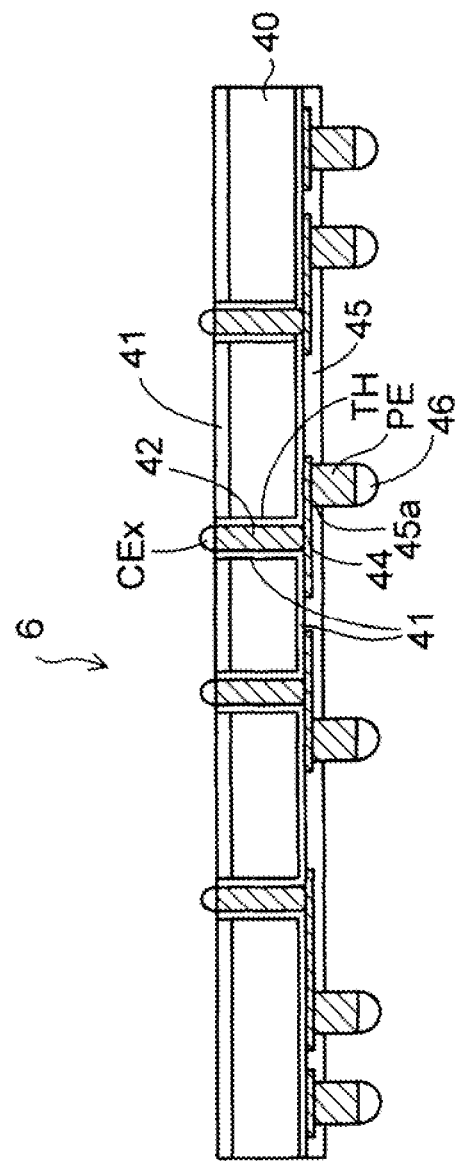
FIG. 7 is a sectional view depicting the manufacturing method of the electronic component device according to the exemplary embodiment (3 thereof).

Subsequently, as shown in FIG. 7, a semiconductor chip 6 is prepared. The semiconductor chip 6 is an example of the second electronic component, and is a CPU using a silicon substrate, for example.

In the first semiconductor chip 6, a chip substrate 40 made of silicon is formed with through-holes TH penetrating in a thickness direction thereof. Also, an insulating layer 41 is formed on inner surfaces of the through-holes TH and upper and lower surfaces of the chip substrate 40.

As the insulating layer 41, a silicon oxide layer ($SiO_2$ layer), a silicon nitride layer (SiN layer), a polyimide layer or the like is used. The through-hole TH is filled with a through-electrode 42 made of copper or copper alloy.

An upper end of the through-electrode 42 is formed with a connection electrode CEx such as a nickel/gold plating layer, a solder or the like.

Also, the lower surface of the chip substrate 40 is formed with a wiring layer 44 connected to lower ends of the through-electrodes 42. The wiring layer 44 is formed of aluminum, copper or alloy thereof. Also, the lower surface of the chip substrate 40 is formed with a passivation film 45 having openings 45a formed on connection parts of the wiring layer 44.

The passivation film 45 is formed of a silicon oxide layer, a silicon nitride layer, a polyimide resin or the like.

The connection parts of the wiring layer 44 are provided with upright columnar electrodes PE. A tip of the columnar electrode PE is formed with a round bump-shaped solder 46. The columnar electrode PE is made of copper or copper alloy, for example.

In this way, the columnar electrodes PE provided on the lower surface-side of the semiconductor chip 6 are electrically connected to the connection electrodes CEx provided on the upper surface-side via the wiring layer 44 and the through-electrodes 42, so that the upper and lower surface-sides are conductive to each other.

The lower surface-side of the semiconductor chip 6 is an element formation surface, and the element formation surface is formed with a variety of elements such as a transistor, a capacitor, a resistance and the like (not shown), which are connected to a multilayered wiring to configure an electronic circuit.

The electronic circuit in the semiconductor chip 6 is connected to the columnar electrodes PE via the wiring layer 44.

An area of the sealing resin material 30a shown in FIG. 6 is set to be greater than an area of the semiconductor chip 6. For example, the area of the sealing resin material 30a is about 9 mm×9 mm, and the area of the semiconductor chip 6 is about 6 mm×6 mm.

Figure 8:
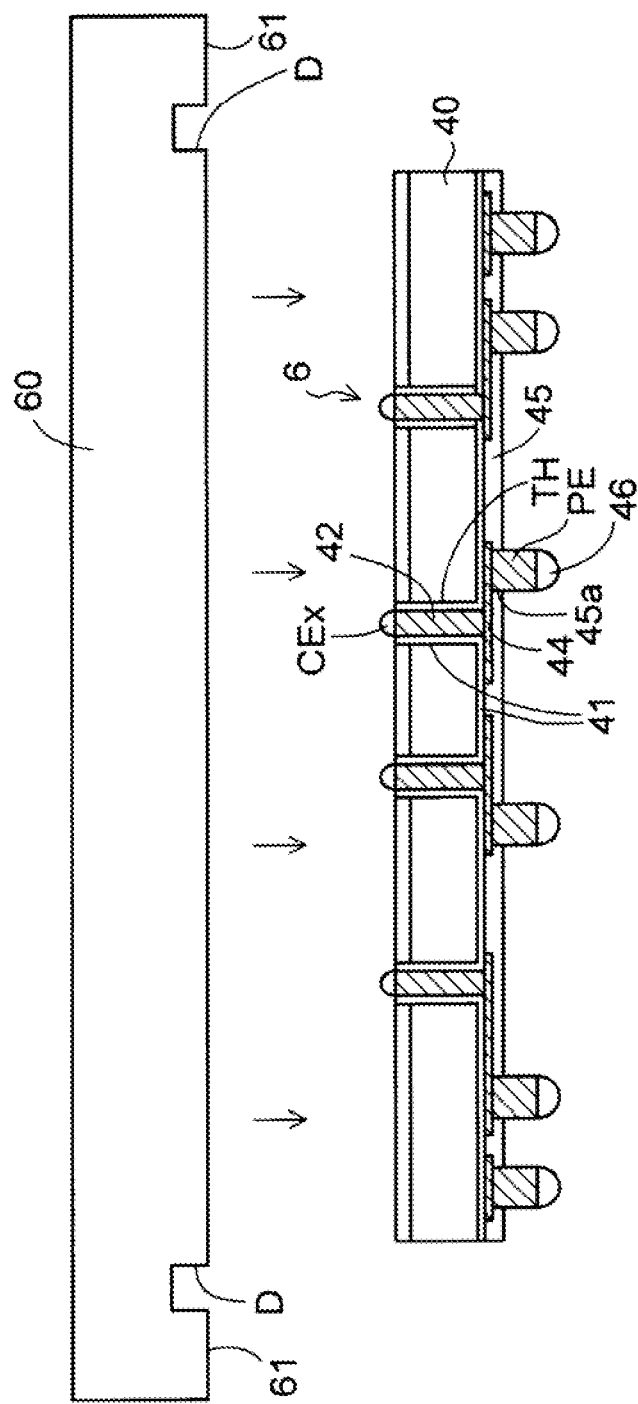
FIG. 8 is a sectional view depicting the manufacturing method of the electronic component device according to the exemplary embodiment (4 thereof).

Subsequently, as shown in FIG. 8, a bonding tool 60 is prepared. The bonding tool 60 is formed of metal, ceramics such as alumina, or the like. Also, the bonding tool 60 has a plurality of suction holes (not shown) for sucking a work in a vacuum manner and a heating unit (not shown) configured by a heat generation resistor, an infrared lamp or the like.

Also, a peripheral edge portion 61 of the bonding tool 60 is formed with hole-shaped concave portions D side by side. The concave portions D formed at the peripheral edge portion 61 of the bonding tool 60 are provided so as to form convex portions, which are to function as a spacer, in an underfill resin arranged around the semiconductor chip 6, as described later.

The bonding tool 60 is connected to a moving mechanism (not shown), and is configured to move to a desired coordinate position in horizontal and vertical directions.

Figure 9:
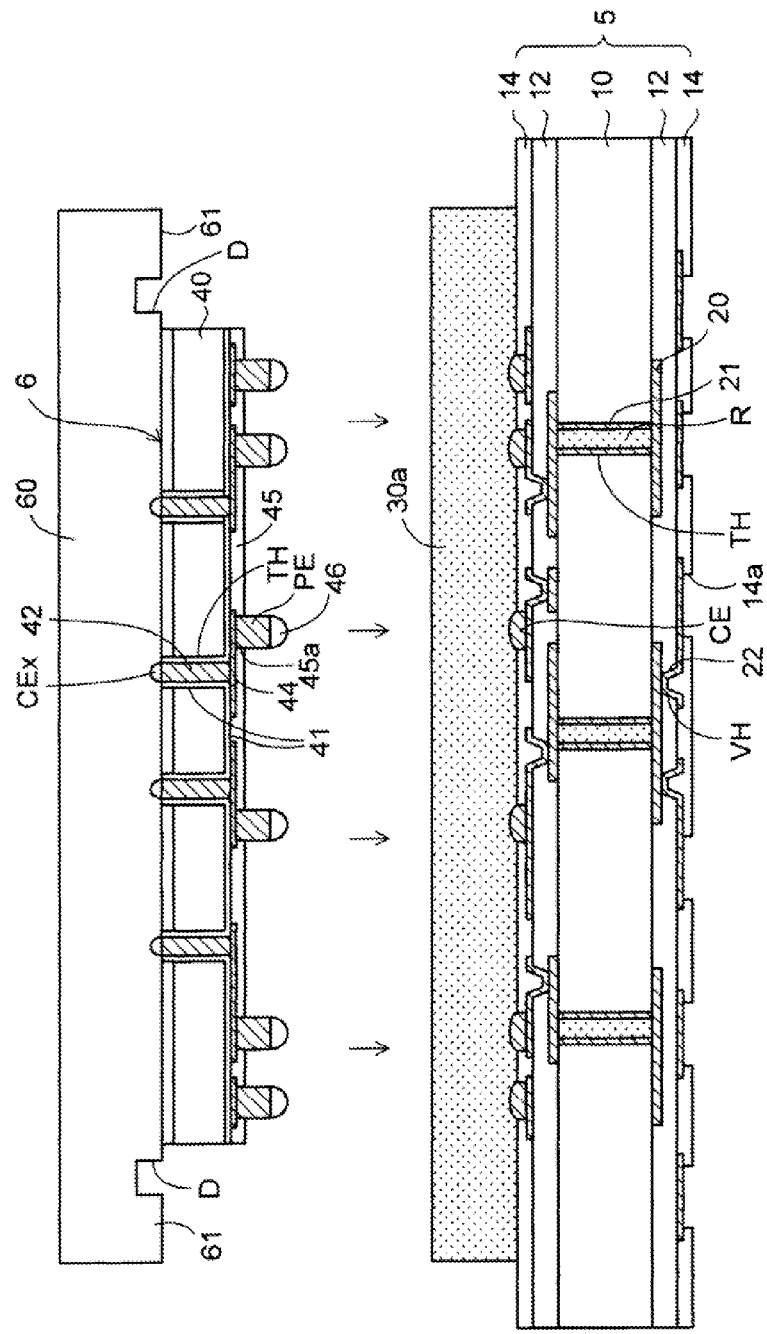
FIG. 9 is a sectional view depicting the manufacturing method of the electronic component device according to the exemplary embodiment (5 thereof).

Also, as shown in FIG. 9, the backside of the semiconductor chip 6 shown in FIG. 7 is sucked to the bonding tool 60. An area of the bonding tool 60 is set to be greater than the area of the semiconductor chip 6, and is substantially the same as the area of the sealing resin material 30a on the wiring substrate 5.

For this reason, the peripheral edge portion 61 and the concave portions D of the bonding tool 60 are exposed outwards from side surfaces of the semiconductor chip 6.

Subsequently, as shown in FIG. 9, the wiring substrate 5 (refer to FIG. 6) having the sealing resin material 30a formed thereon is arranged on a bonding stage (not shown), and the wiring substrate 5 is heated to about 100° C. to soften the sealing resin material 30a.

Then, the columnar electrodes PE of the semiconductor chip 6 sucked to the bonding tool 60 are pushed into the sealing resin material 30a on the wiring substrate 5.

Figure 10:
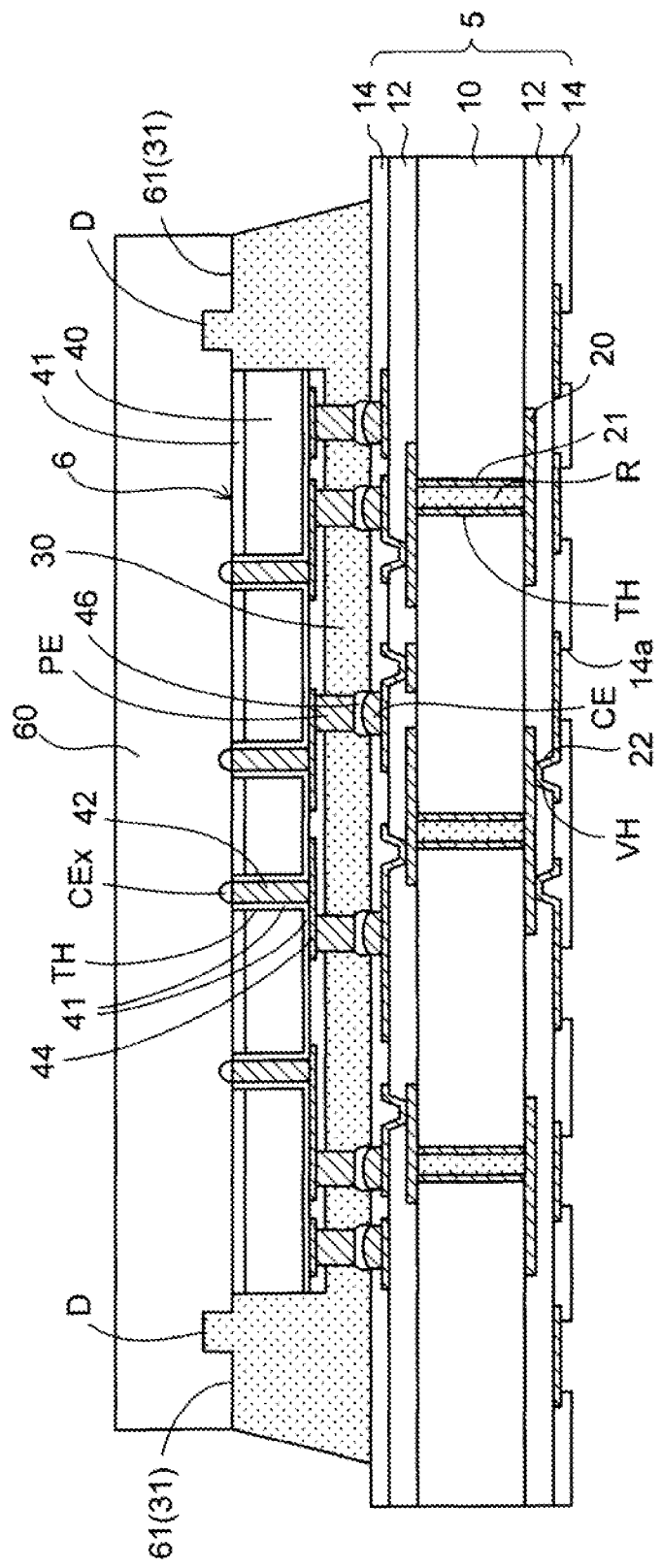
FIG. 10 is a sectional view depicting the manufacturing method of the electronic component device according to the exemplary embodiment (6 thereof).

Thereby, as shown in FIG. 10, the columnar electrodes PE of the semiconductor chip 6 are pressure-contacted to the connection electrodes CE of the wiring substrate 5 via the solders 46. Subsequently, the reflow heating is performed from the bonding tool 60, so that the solders 46 are melted to flip-chip connect the columnar electrodes PE of the first semiconductor chip 6 to the connection electrodes CE of the wiring substrate 5 through the solder 46.

As the solder 46, lead-free solder such as tin/silver-based solder, tin/silver/copper-based solder or the like is used, for example. The reflow temperature is set to about 260° C.

When performing the reflow heating, the semi-cured sealing resin material 30a is also cured at the same time and a first cured underfill resin 30 is formed below the semiconductor chip 6.

At this time, the peripheral edge portion of the sealing resin material 30a arranged outside the semiconductor chip 6 is pressed and molded by a lower surface of the peripheral edge portion 61 of the bonding tool 60. At the same time, the concave portions D of the peripheral edge portion 61 of the bonding tool 60 are filled with the sealing resin material 30a.

Figure 11:
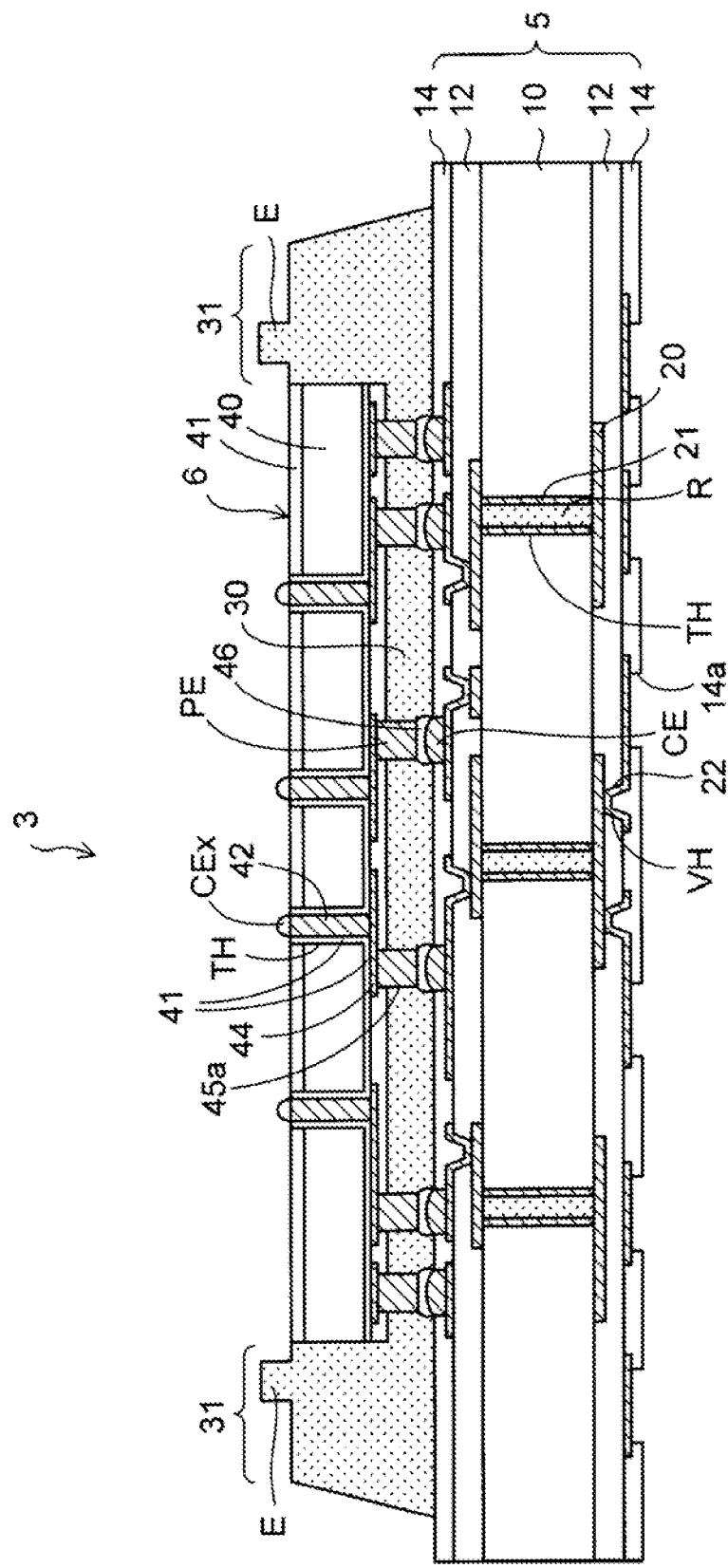
FIG. 11 is a sectional view depicting the manufacturing method of the electronic component device according to the exemplary embodiment (7 thereof).

Thereafter, as shown in FIG. 11, the bonding tool 60 is removed from the semiconductor chip 6. In this way, the first underfill resin 30 is filled between the semiconductor chip 6 and the wiring substrate 5. At the same time, the first underfill resin 30 extends to a region surrounding the semiconductor chip 6, and is formed as an annular base part 31.

Also, the base part 31 of the first underfill resin 30 is formed to have convex portions E on an upper surface thereof, which are obtained by the concave portions D of the bonding tool 60.

The upper surface of the base part 31 except for the convex portions E of the first underfill resin 30 is arranged to be flush with the upper surface of the semiconductor chip 6.

Figure 12:
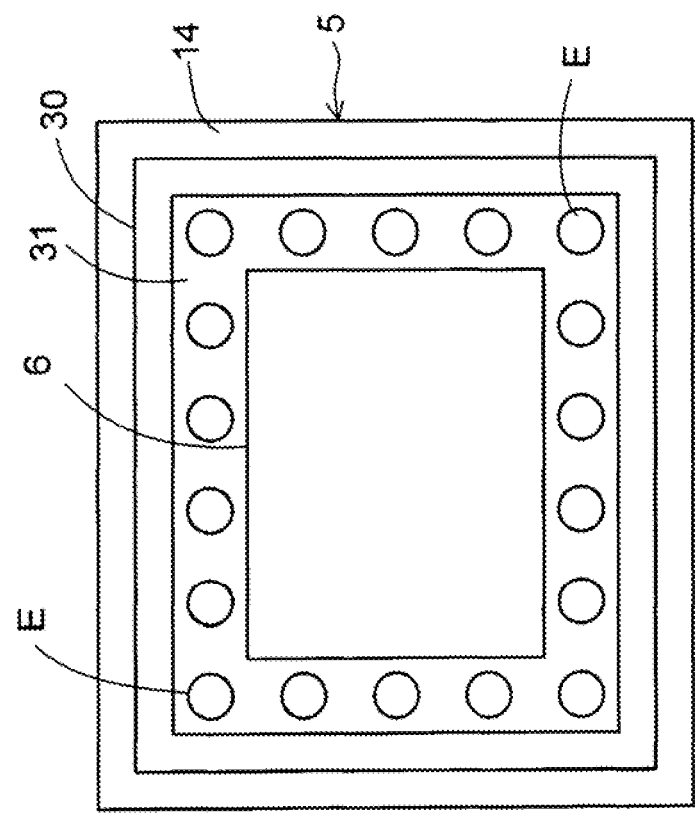
FIG. 12 is a reduced plan view of a structure of FIG. 11, as seen from above.

FIG. 12 is a reduced plan view of FIG. 11. As shown in FIG. 12, the semiconductor chip 6 has a rectangular shape, as seen from above, and the convex portions E of the base part 31 of the semiconductor chip 6 are arranged with being divided in the area surrounding the semiconductor chip 6. In FIG. 12, the connection electrodes CEx of the semiconductor chip 6 and the like are not shown.

The convex portion E of the first underfill resin 30 can be formed to have a variety of shapes such as a rectangular shape or the like, in addition to a circular shape, as seen from above. When the convex portion E of the first underfill resin 30 has a circular shape, a diameter of the convex portion E is 20 μm to 100 μm, and a height thereof is about 20 μm.

In this way, a fillet part is formed so that most of the resin is arranged at the fillet part of the first underfill resin 30. Thereby, the base part 31 and the convex portions E of the first underfill resin 30 are formed around the semiconductor chip 6.

An area of the first underfill resin 30 including the base part 31 is about 12 mm×12 mm.

By the above processes, as shown in FIG. 11, an electronic member 3 having a structure where the base part 31 of the first underfill resin 30 is arranged around the semiconductor chip 6 mounted on the wiring substrate 5 and the convex portions E are formed on the upper surface of the base part 31 is manufactured.

Figure 13:
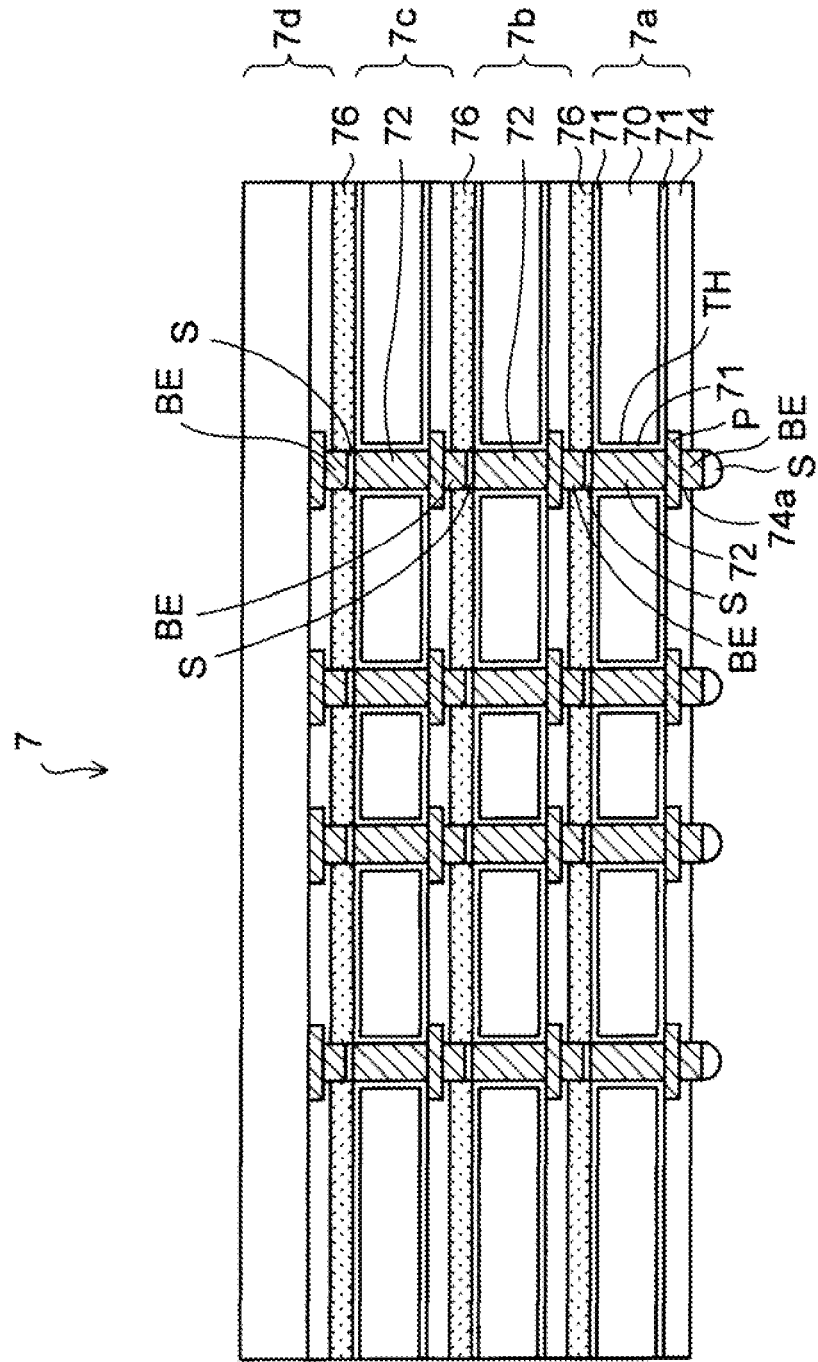
FIG. 13 is a sectional view depicting the manufacturing method of the electronic component device according to the exemplary embodiment (8 thereof).

Subsequently, as shown in FIG. 13, a semiconductor module 7 to be stacked on the semiconductor chip 6 of the electronic member 3 shown in FIG. 11 is prepared. The semiconductor module 7 has first to fourth semiconductor chips 7a, 7b, 7c, 7d stacked therein. The semiconductor module 7 is an example of the third electronic component. For example, each of the semiconductor chips 7a to 7d is a memory chip using a silicon substrate.

In the first semiconductor chip 7a, a chip substrate 70 made of silicon is formed with through-holes TH penetrating in a thickness direction thereof. Also, an insulating layer 71 is formed on inner surfaces of the through-holes TH and upper and lower surfaces of the chip substrate 70.

As the insulating layer 71, a silicon oxide layer (SiO$_2$ layer), a silicon nitride layer (SiN layer), a polyimide layer or the like is used. The through-hole TH is filled with a through-electrode 72.

A lower surface of the chip substrate 70 is formed with connection pads P connected to lower ends of the through-electrodes 72. The through-electrode 72 and the connection pad P are formed of copper or copper alloy. Also, the lower surface of the chip substrate 70 is formed with a passivation film 74 having openings 74a arranged on the connection pads P.

The passivation film 74 is formed of a silicon oxide layer, a silicon nitride layer, a polyimide resin or the like.

The connection pads P are formed thereon with bump electrodes BE, and tips of the bump electrodes BE are formed with round solders S. The bump electrode BE is made of copper or copper alloy, for example.

In this way, the bump electrodes BE provided on the lower surface-side of the first semiconductor chip 7a are electrically connected to the connection parts provided on the upper ends of the through-electrodes 72 via the connection pads P and the through-electrodes 72, so that the upper and lower surface-sides are conductive to each other.

Like the semiconductor chip 6 of FIG. 7, the lower surface-side of the first semiconductor chip 6 is an element formation surface. The element formation surface is formed with a variety of elements such as a transistor, a capacitor, a resistance and the like (not shown), which are connected to a multilayered wiring to configure an electronic circuit. The electronic circuit is connected to the connection pads P.

The second semiconductor chip 7b having the same structure as the first semiconductor chip 7a is stacked on a backside of the first semiconductor chip 7a. The bump electrodes BE of the second semiconductor chip 7b are connected to the tips of the through-electrodes 72 provided on the backside of the first semiconductor chip 7a via the solders S.

Likewise, the third semiconductor chip 7c having the same structure as the first semiconductor chip 7a is stacked on a backside of the second semiconductor chip 7b. The bump electrodes BE of the third semiconductor chip 7c are connected to the tips of the through-electrodes 72 provided on the backside of the second semiconductor chip 7b via the solders S.

Also, the fourth semiconductor chip 7d having no through-electrode is stacked on a backside of the third semiconductor chip 7c. The bump electrodes BE of the fourth semiconductor chip 7d are connected to the tips of the through-electrodes 72 provided on the backside of the third semiconductor chip 7c via the solders S.

A resin layer 76 made of an epoxy resin or the like is filled in each gap between the first to fourth semiconductor chips 7a to 7d, respectively. By the above processes, the semiconductor module 7 has the four semiconductor chips 7a, 7b, 7c, 7d stacked therein with the resin layers 76 being interposed. The number of stacks of the semiconductor chips in the semiconductor module 7 can be arbitrarily set.

As described in the paragraphs of the preliminary matters, it is difficult to stably melt the solders of the semiconductor module by the method of reflow heating the solders of the thick semiconductor module 7 with the bonding tool.

For this reason, in the exemplary embodiment, the reflow heating is performed using a reflow furnace capable of securely heating the entire semiconductor module 7 to a desired temperature. As shown in a side view of FIG. 14, during surface mounting, an electronic component is mounted on a substrate by a chip mourner 82, and the substrate is conveyed to a reflow furnace 80 by a belt conveyor 84.

In the reflow furnace 80, a plurality of heating chambers and cooling chambers (not shown) is provided, and the substrate having the electronic component mounted thereon is subjected to respective processing of heating and cooling in accordance with a predetermined heating profile. As shown in a sectional view of FIG. 14, heating units 86 such as a far-infrared heater are provided on sidewalls of the reflow furnace 80, and the reflow heating is performed at an atmosphere of a heating chamber replaced with a nitrogen gas.

Figure 15A:
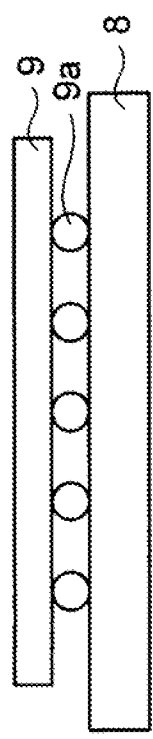
FIGS. 15A to 15C pictorially depict problems that are to occur when heating a multi-layer substrate with the reflow furnace of FIG. 14.
Figure 15B:
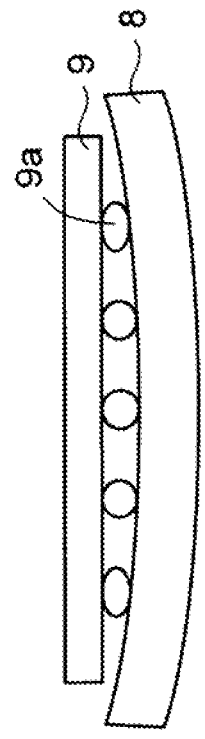
Figure 15C:
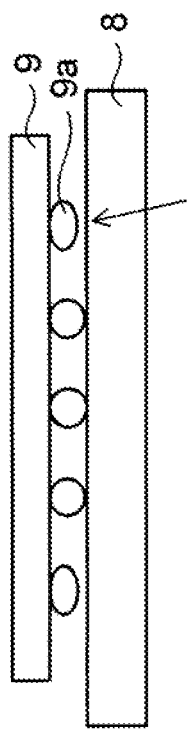

FIGS. 15A to 15C depict problems that are to occur when performing the reflow heating for a multi-liner substrate by the reflow furnace 80. As shown in FIG. 15A, solder bumps 9a of an electronic component 9 are arranged on pads of a substrate 8 by the chip mounter 82 shown in FIG. 14.

Subsequently, the solder bumps 9a of the electronic component 9 are melted in the heating chamber of the reflow furnace 80 shown in FIG. 14 and connected to the pads of the substrate 8. At this time, as shown in FIG. 15B, since the large-sized substrate 8 is entirely heated in the reflow furnace 80, unlike the heating from the bonding tool, a concave-shaped bending occurs in the substrate 8. In contrast, since an area of the electronic component 9 is small, a degree of the bending is negligible.

For this reason, the solder bumps 9a provided at a peripheral edge portion of the electronic component 9 are melted with being crushed by the substrate 8, which results from the bending of the substrate 8. At this state, when the cooling is performed in the cooling chamber of the reflow furnace 80, since the bending of the substrate 8 is restored to its original state, the crushed solder bumps 9a provided at the peripheral edge portion of the electronic component 9 are separated from the pads of the substrate 8.

As a measure against the above problem, FIGS. 16A to 16D depict a principle for solving the problem described with reference to FIGS. 15A to 15C.

As shown in FIG. 16A, the substrate 8 having convex portions 8a arranged in a ring-shaped region of the peripheral edge portion and configured to function as a spacer is used. As shown in FIG. 168, the solder bumps 9a of the electronic component 9 are arranged on the pads of the substrate 8 by the chip mounter 82 shown in FIG. 14. At this time, the solder bumps 9a of the electronic component 9 are arranged on the pads of the substrate 8 at a state where the peripheral edge portion of the electronic component 9 is in contact with the convex portions 8a of the substrate 8.

Then, as shown in FIG. 16C, the solder bumps 9a of the electronic component 9 are melted in the heating chamber of the reflow furnace 80 shown in FIG. 14 and connected to the pads of the substrate 8. At this time, like the process shown in FIG. 15B, a concave-shaped bending occurs in the large-sized substrate 8.

However, since the convex portions 8a of the substrate 8 function as a spacer, a gap is secured between the peripheral edge portion of the electronic component 9 and the substrate 8. For this reason, even when the substrate 8 is bent in the concave shape, the solder bumps 9a provided at the peripheral edge portion of the electronic component 9 is prevented from being crushed.

As a result, as shown in FIG. 16D, even when the cooling is performed in the cooling chamber of the reflow furnace 80 and the bending of the substrate 8 is thus restored to its original state, the solder bumps 9a provided at the peripheral edge portion of the electronic component 9 remain connected without being separated from the pads of the substrate 8.

Figure 17:
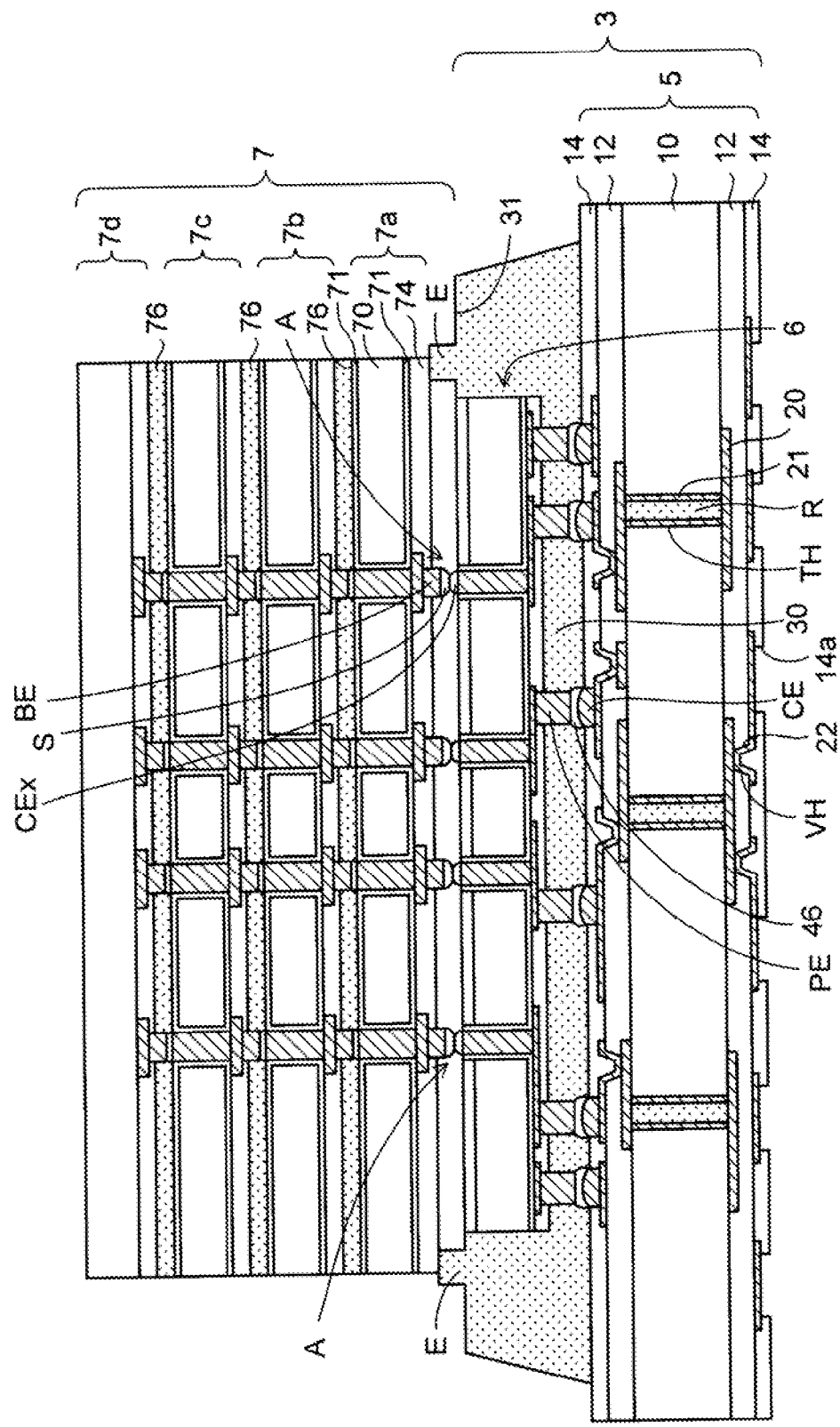
FIG. 17 is a sectional view depicting the manufacturing method of the electronic component device according to the exemplary embodiment (9 thereof).

A method of stacking the semiconductor module 7 of FIG. 13 on the electronic member 3 of FIG. 11 on the basis of the above principle is described. As shown in FIG. 17, the electronic member 3 of FIG. 11 is prepared. The convex portions E formed on the base part 31 of the first underfill resin 30 of the electronic member 3 correspond to the convex portions 8a of the substrate 8 shown in FIG. 16A and function as the same spacer.

As shown in FIG. 17, the solders S on the tips of the bump electrodes BE of the semiconductor module 7 of FIG. 13 are arranged on the connection electrodes CEx of the semiconductor chip 6 of the electronic member 3 by the chip mounter 82 shown in FIG. 14.

At this time, the peripheral, edge portion of the semiconductor module 7 is in contact with the convex portions E of the electronic member 3. The bump electrodes BE of the semiconductor module 7 are temporarily bonded to the connection electrodes CEx of the semiconductor chip 6 by using adhesiveness of a flux (not shown).

A height of the convex portion F of the first underfill resin 30 of the electronic member 3 is set to correspond to an interval obtained by adding both a height of the bump electrode BE and solder S from the lower surface of the semiconductor module 7 and a height of the connection electrode CEx of the semiconductor chip 6.

Subsequently, the electronic member 3 having the semiconductor module 7 mounted thereon is conveyed to the heating chamber of the reflow furnace 80 shown in FIG. 14 and is subjected to the reflow heating. Like the process of FIG. 10, when the lead-free solder is used as the solder S, the reflow temperature is set to about 260° C.

Thereby, the bump electrodes BE of the semiconductor module 7 are connected to the connection electrodes CEx of the semiconductor chip 6 via the solders S. The highest temperature in the reflow furnace 80 is set to a temperature at which the solders S are to be melted.

By using the reflow furnace 80 configured as described above, even when the semiconductor module 7 is a thick multi-layer type, it is possible to sufficiently melt the solders S on the tips of the bump electrodes BE of the semiconductor module 7 by the reflow heating.

At this time, since the large-sized wiring substrate 5 having the semiconductor chip 6 mounted thereon is entirely heated by the reflow furnace 80, the concave-shaped bending occurs in the wiring substrate 5, like FIG. 16C.

The substrate 8 of FIG. 16C corresponds to the electronic member 3 (FIG. 17) including the wiring substrate 5, the first underfill resin 30 and the semiconductor chip 6, and the electronic component 9 of FIG. 16C corresponds to the semiconductor module 7 of FIG. 17.

As described above with reference to FIG. 16C, even when the concave-shaped bending occurs in the electronic member 3, since the peripheral edge portion of the electronic member 3 is formed with the convex portions E, a gap with the semiconductor chip 6 is secured over the entire lower surface of the semiconductor module 7.

For this reason, the solder S of a part denoted with 'A' in FIG. 17 is prevented from being melted with being crushed.

Subsequently, the electronic member 3 having the semiconductor module 7 mourned thereon is cooled in the cooling chamber of the reflow furnace 80 shown in FIG. 14. At this time, like FIG. 16D, even when the bending of wiring substrate 5 is restored to its original state, the solders S provided at the peripheral edge portion of the semiconductor module 7 remain connected without being separated from the connection electrodes CEx of the semiconductor chip 6.

Also, since the semiconductor module 7 is in contact with the convex portions E of the first underfill resin 30 of the electronic member 3, the semiconductor module 7 is arranged at the height positions of the upper surfaces of the convex portions E. Thereby, when melting the solders S of the semiconductor module 7 by the reflow heating, the semiconductor module 7 is prevented from being connected with being inclined.

Then, as shown in FIG. 18, a second under-fill resin 32 is filled in the gap between the semiconductor module 7 and the electronic member 3 by a dispenser or the like. At this time, the convex portions E provided at the peripheral edge portion of the electronic member 3 are in contact with the lower surface of the semiconductor module 7 but are arranged with being separated at an interval.

For this reason, it is possible to fill the second underfill resin 32 through the interval of the convex portions E of the electronic member 3. The second underfill resin 32 is formed of the same resin as the first underfill resin 30.

The second underfill resin 32 is formed with covering the upper surface of the base part 31 of the first underfill resin 30 and parts of side surfaces of the semiconductor module 7.

Then, as shown in FIG. 19, a mold resin 34 such as an epoxy resin is formed on the electronic member 3 and the semiconductor module 7. Thereby, the upper surface of the wiring substrate 5, the respective side surfaces of the first and second underfill resins 30, 32, and the side surfaces and upper surface of the semiconductor module 7 are sealed by the resin.

Also, solder balls are mounted to the connection parts of the second wiring layer 22 on the lower surface-side of the wiring substrate 5, so that external connection terminals T are formed. Then, the wiring substrate 5 is cut so as to obtain each component mounting region in which the semiconductor chip 6 and the semiconductor module 7 are stacked.

By the above processes, an electronic component device 1 of the exemplary embodiment is manufactured.

In the exemplary embodiment, after the semiconductor module 7 is connected to the semiconductor chip 6 on the wiring substrate 5, the second underfill resin 32 is filled in the gap below the semiconductor module 7. In addition to this, before connecting the semiconductor module 7, a resin material may be formed on the semiconductor chip 6 on the wiring substrate 5, and the bump electrodes BE of the semiconductor module 7 may be connected to the connection electrodes CEx of the semiconductor chip 6 via the resin material.

Also in this case, the reflow heating is performed in the reflow furnace. At this time, the resin material is cured, and the second underfill resin 32 is filled in the gap between the semiconductor module 7 and the semiconductor chip 6, like FIG. 18. When using the above sealing technology, the convex portions E of the base part 31 of the first underfill resin 30 may be coupled in a ring shape without being divided, in FIG. 12. In this case this a ring-shaped convex portion has at least one port or hole for preventing the void from being generated.

As shown in FIG. 19, in the electronic component device 1 of the exemplary embodiment, the columnar electrodes PE of the semiconductor chip 6 shown in FIG. 7 are flip-chip connected to the connection electrodes CE provided on the upper surface-side of the wiring substrate 5 shown in FIG. 5, via the solders 46. The semiconductor chip 6 is an example of the second electronic component.

The first underfill resin 30 is filled between the semiconductor chip 6 and the wiring substrate 5. The first underfill resin 30 is formed to have the annular base part 31 extending from the region between the semiconductor chip 6 and the wiring substrate 5 towards the region around the semiconductor chip 6.

Also, the base part 31 of the first underfill resin 30 is formed to have the convex portions E on the upper surface. As described above, the base part 31 and the convex portions E of the first underfill resin 30 are formed as the sealing resin material 30a is molded by the lower surface of the peripheral edge portion 61 having the concave portions D of the bonding tool 60. For this reason, the base part 31 and the convex portions E of the first underfill resin 30 are integrally formed.

Also, the bump electrodes BE of the semiconductor module 7 shown in FIG. 13 are connected to the connection electrodes CEx on the upper surface-side of the semiconductor chip 6 via the solders S. The area of the semiconductor module 7 is set to be greater than the area of the semiconductor chip 6. The semiconductor module 7 is an example of the third electronic component.

The lower surface of the peripheral edge portion of the semiconductor module 7 is arranged with being in contact with the upper surfaces of the convex portions E of the base part 31 of the first underfill resin 30. The side surface of the semiconductor module 7 is arranged in a region between the side surface of the semiconductor chip 6 and the side surface of the base part 31 of the first underfill resin 30.

Also, the second underfill resin 32 is filled between the semiconductor chip 6 and the semiconductor module 7. The second underfill resin 32 extends from the region between the semiconductor chip 6 and the semiconductor module 7 towards the upper surface of the base part 31 of the first underfill resin 30, and covers the convex portions E of the base part 31 and parts of the side surfaces of the first semiconductor chip 7a, which is the lowest chip of the semiconductor module 7.

Like this, in the electronic component device 1 of the exemplary embodiment, the base part 31 of the first underfill resin 30 is formed around the semiconductor chip 6, and the upper surface of the base part 31 is formed with the convex portions E. At a state where the peripheral edge portion of the semiconductor module 7 is in contact with the convex portions E of the base part 31, the bump electrodes BE of the semiconductor module 7 are connected to the connection electrodes CEx of the semiconductor chip 6 via the solders S.

In the electronic component device 1 of the exemplary embodiment, as described above, when connecting the thick semiconductor module 7 to the semiconductor chip 6 on the wiring substrate 5, the reflow heating is performed by the reflow furnace 80, not the bonding tool.

For this reason, since the thick semiconductor module 7 is securely heated to the set temperature as a whole, the solders S on the tips of the bump electrodes BE of the semiconductor module 7 can be sufficiently melted.

At this time, as described above, when connecting the semiconductor module 7 to the semiconductor chip 6 on the wiring substrate 5 through the heating in the reflow furnace, the concave-shaped bending occurs in the wiring substrate 5. However, the convex portions E of the base part 31 of the first underfill resin 30 function as a spacer for securing the gap between the peripheral edge portion of the semiconductor module 7 and the wiring substrate 5.

For this reason, even when the concave-shaped bending occurs in the wiring substrate 5, the gap with the semiconductor chip 6 is secured over the entire lower surface of the semiconductor module 7. Thereby, the solders S on the tips of the bump electrodes BE provided at the peripheral edge portion of the semiconductor module 7 are prevented from being crushed, so that the connection fracture between the bump electrodes BE of the semiconductor module 7 and the connection electrodes CEx of the semiconductor chip 6 is avoided.

As a result, it is possible to secure the connection reliability between the semiconductor module 7 and the semiconductor chip 6 and to improve the manufacturing yield of the electronic component device.

Other Exemplary Embodiments

In the exemplary embodiment, the semiconductor chip 6 and the semiconductor module 7 are stacked in order with being disposed on and connected to the wiring substrate 5. In addition to this, a semiconductor chip may be adopted instead of the wiring substrate 5, and two semiconductor chips and the semiconductor module may be stacked to form the same configuration.

Alternatively, instead of the semiconductor chip 6, other wiring substrate such as a silicon interposer may be adopted, and the other wiring substrate and the semiconductor chips may be stacked on the wiring, substrate, thereby forming the same configuration.

Also, instead of the semiconductor chip 6 and the semiconductor module 7, a variety of wiring substrates may be adopted, and three wiring substrates may be stacked to form the same configuration. In this way, the variety of electronic components may be combined and stacked to configure the electronic component device.

[Clauses]

This disclosure further encompasses various exemplary embodiments, for example, described below.

1. A manufacturing method of an electronic component device comprising:

forming, a sealing resin material on a first electronic component;

connecting an electrode of a second electronic component to the first electronic component via the sealing resin material, filling a first underfill resin between the first electronic component and the second electronic component, and forming a base part having a convex portion on an upper surface thereof around the second electronic component by the first underfill resin;

arranging a peripheral edge portion of a third electronic component on the convex portion of the first underfill resin, and connecting the third electronic component on the second electronic component via to solder on the basis of heating processing in a reflow furnace; and filling a second underfill resin between the second electronic component and the third electronic component.

2. The manufacturing method of an electronic component device according to claim 1, wherein the third electronic component is a semiconductor module in which a plurality of semiconductor chips is stacked with a resin layer being interposed therebetween.

3. The manufacturing method of an electronic component device according to claim 1, wherein in the forming the base part having the convex portion on the upper surface thereof around the second electronic component by the first underfill resin, the second electronic component is pushed into the sealing resin material with being sucked to a bonding tool having an area greater than the second electronic component, a peripheral edge portion of the bonding tool being formed with a concave portion, and a peripheral edge portion of the sealing, resin material is pressed by the peripheral edge portion of the bonding tool, so that the base part and the convex portion are formed.

4. The manufacturing method of an electronic component device according to claim 1, wherein in the forming the base part having the convex portion on the upper surface thereof by the first underfill resin, the convex portion of the first underfill resin is arranged with being divided in a region surrounding the second electronic component.

What is claimed is:

1. An electronic component device comprising:
   a first electronic component;
   a second electronic component disposed on and connected to the first electronic component;
   a first underfill resin filled between the first electronic component and the second electronic component, the first underfill resin having a base part arranged around the second electronic component with a plurality of convex portions formed on an upper surface of the base part, wherein, except for the plurality of convex portions, the base part is coplanar with an upper surface of the second electronic component;
   a third electronic component disposed on and connected to the second electronic component with the third electronic component being arranged at a height position of an upper surface of the plurality of convex portions of the base part so that a bottom surface of the third electronic component is in contact with the upper surface of the plurality of convex portions of the base part at a peripheral edge portion thereof; and
   a second underfill resin filled between the second electronic component and the third electronic component,
   wherein the plurality of convex portions of the base part are arranged with adjacent convex portions of the plurality of convex portions being separated from each other, in a region surrounding the second electronic component.

2. The electronic component device according to claim 1, wherein the third electronic component is a semiconductor module in which a plurality of semiconductor chips is stacked with a resin layer being interposed therebetween.

3. The electronic component device according to claim 1, wherein the plurality of convex portions of the first underfill resin is integrally formed with the base part.

4. The electronic component device according to claim 1, wherein an area of the third electronic component is greater than an area of the second electronic component, and
   wherein the second underfill resin covers an upper surface of the base part of the first underfill resin and a part of a side surface of the third electronic component.

5. The electronic component device according to claim 1, wherein a side surface of the third electronic component is arranged in a region between a side surface of the second electronic component and a side surface of the base part of the first underfill resin.

6. The electronic component device according to claim 1, wherein the first electronic component is electrically connected to the second electronic component via an electrode.

7. The electronic component device according to claim 1, wherein the second electronic component is electrically connected to the third electronic component via an electrode.

8. The electronic component device according to claim 1, further comprising:
   a mold resin sealing the first electronic component, the second electronic component, the third electronic component, the first underfill resin, and the second underfill resin.

9. The electronic component device according to claim 1, wherein the first electronic component is a wiring substrate and the second electronic component is a semiconductor chip.

10. The electronic component device according to claim 1, wherein the first electronic component and the second electronic component are each a semiconductor chip.

11. The electronic component device according to claim 1, wherein the first electronic component and the second electronic component are each a wiring substrate.

* * * * *